US006791832B2

(12) United States Patent
Budny et al.

(10) Patent No.: US 6,791,832 B2
(45) Date of Patent: Sep. 14, 2004

(54) ELECTRONIC PACKAGE

(75) Inventors: Jacek Budny, Gdynia (PL); Gerard Wisniewski, Gdansk (PL)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 10/106,775

(22) Filed: Mar. 26, 2002

(65) Prior Publication Data

US 2003/0184966 A1 Oct. 2, 2003

(51) Int. Cl.[7] .................................................. G06F 1/20
(52) U.S. Cl. ....................... 361/687; 361/719; 174/16.3; 257/712
(58) Field of Search ................................. 257/704, 686, 257/706, 712, 718; 361/685, 687, 680, 690, 695, 697, 699, 704, 707, 710, 712–718, 719; 165/80.3, 80.4, 104.33; 174/16.3

(56) References Cited

U.S. PATENT DOCUMENTS

| 5,109,318 | A | * | 4/1992 | Funari et al. ............... 361/728 |
| 5,892,660 | A | * | 4/1999 | Farnworth et al. .......... 361/728 |
| 6,198,758 | B1 | * | 3/2001 | Broderick et al. ............ 372/36 |
| 6,355,504 | B1 | * | 3/2002 | Jiang .......................... 438/118 |
| 6,432,744 | B1 | * | 8/2002 | Amador et al. ............. 438/108 |
| 6,653,730 | B2 | * | 11/2003 | Chrysler et al. ............ 257/704 |
| 2003/0194537 | A1 | * | 10/2003 | Bhagwagar et al. ........ 428/174 |

* cited by examiner

*Primary Examiner*—Hung Van Duong
(74) *Attorney, Agent, or Firm*—Schwegman, Lundberg, Woessner & Kluth, P.A.

(57) ABSTRACT

An electronic package for providing an increased density of electronic components in systems includes electronic components mounted on two surfaces of a substrate. Electrical coupling is provided by electrical contacts mounted with substantially the same arrangement and number on both surfaces of the substrate. Two conductive substrates having apertures are mounted adjacent and substantially parallel to the two component mounting surfaces such that the electrical contacts mounted on the two surfaces protrude through the apertures of the two conductive substrates. The two conductive substrates are coupled to one or more heat sinks to conduct heat away from the multiple electronic components contained between the conductive substrates. Multiple electronic packages can be coupled together to form a stacked electronic package by physically connecting the electrical contacts of the electronic packages.

26 Claims, 5 Drawing Sheets

ELECTRONIC PACKAGE

FIELD

This invention relates to electronics and, more particularly, to electronic packages.

BACKGROUND

In modern electronic systems, electronic devices, such as resistors, capacitors, transistors, logic gates, and processors are formed on substrates fabricated from materials such as silicon, germanium, and gallium arsenide. These substrates are mounted directly on the surface of a system board or packaged in modules, such as ceramic or plastic modules, which are mounted on the surface of a system board.

Several problems arise in modem electronic systems that follow this die-on-board or module-on-board packaging strategy. First, for dice or modules located at opposite ends of a system board, the transit-time for signals between the dice or modules can be unacceptably long. Second, dice or modules packaged together on a system board can overheat and cause the system to fail.

One solution to the transit-time problem requires laying out the system board so that the modules or dice that communicate with one another are packaged adjacent to each other. Unfortunately, the communications architecture for some systems preclude this solution.

One solution to the overheating problem requires using large fans to cool the system. Unfortunately, large fans are noisy and consume unacceptable amounts of power in some systems.

For these and other reasons there is a need for the present invention.

DESCRIPTION

In the following detailed description of the invention, reference is made to the accompanying drawings which form a part hereof, and in which are shown, by way of illustration, specific embodiments of the invention which may be practiced. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

Figure 1A:
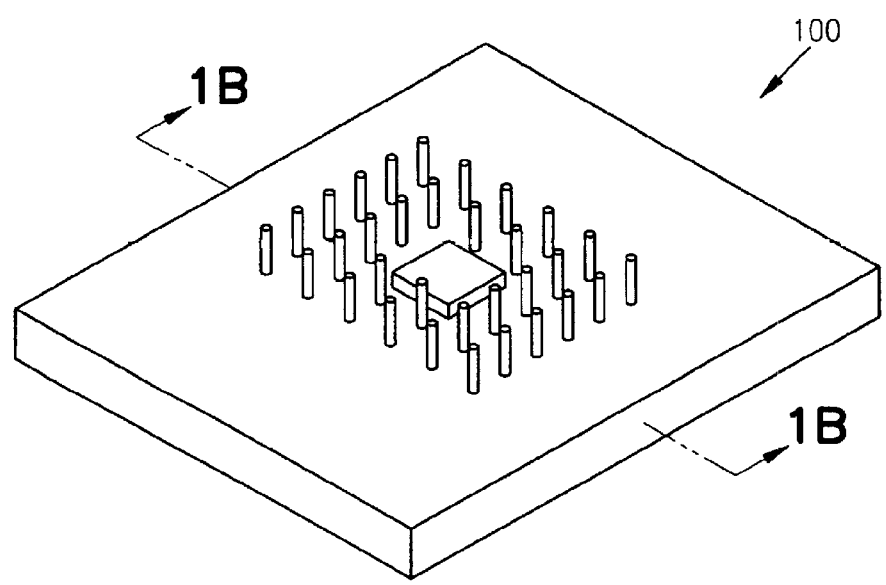
FIG. 1A shows a perspective view of an electronic package in accordance with one embodiment of the invention.

FIG. 1A shows a perspective view of an electronic package 100 in accordance with one embodiment of the invention.

Figure 1B:
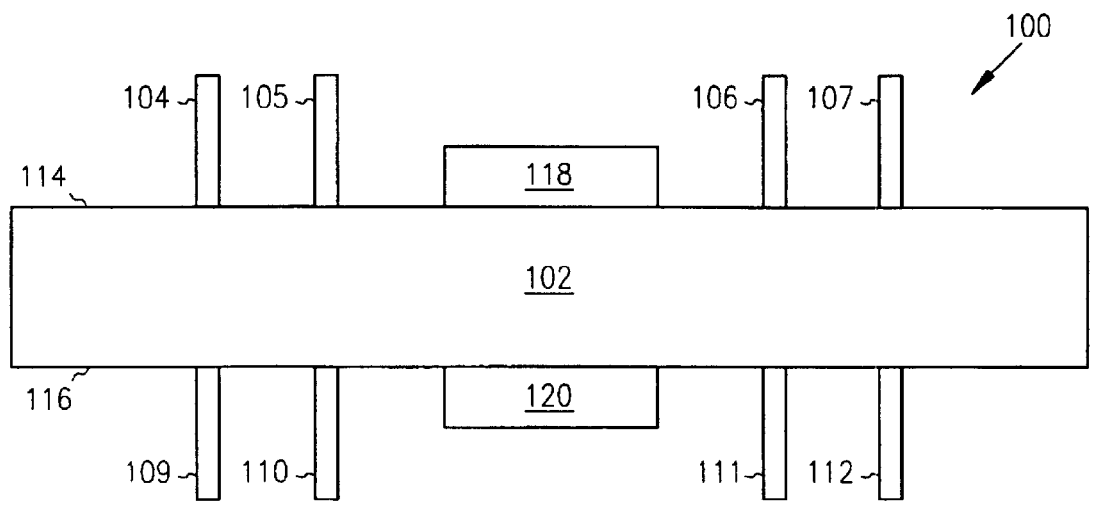
FIG. 1B shows a cross-sectional view of the electronic package shown in FIG. 1A taken along the line XX.

FIG. 1B shows a cross-sectional view of the electronic package 100 shown in FIG. 1A taken along the line XX. The electronic package 100 includes a substrate 102, a first plurality of electrical contacts 104, 105, 106, and 107, and a second plurality of electrical contacts 109, 110, 111, and 112. The substrate 102 has a first component mounting surface 114 and a second component mounting surface 116. The first plurality of electrical contacts 104, 105, 106, and 107 is located on the first component mounting surface 114. The second plurality of electrical contacts 109, 110, 111, and 112 is located on the second component mounting surface 116.

The substrate 102 is not limited to being fabricated from a particular material. In one embodiment, the substrate 102 is a ceramic. In an alternate embodiment, the substrate 102 is an epoxy. In another alternate embodiment, the substrate 102 is a multi-layer copper-clad bismaleimide triazine (BT) laminate. In still another alternate embodiment, the substrate 102 is a non-laminate BT printed circuit board.

The first component mounting surface 114 and the second component mounting surface 116 provide surfaces for mounting electronic components. One or more electronic components 118 can be mounted on the first component mounting surface 114, and one or more electronic components 120 can be mounted on the second component mounting surface 116. The one or more electronic components 118 and 120 are not limited to a particular type of electronic component. Exemplary electronic components suitable for use in connection with electronic package 100 include active components, such as transistors, logic circuits, and amplifiers, passive components, such as resistors, capacitors, and inductors, and integrated circuit components, such as processors, amplifiers, and application specific integrated circuits.

The one or more electronic components 118 and 120 are not limited to being mounted on the first component mounting surface 114 and the second component mounting surface 116 using a particular technology. The one or more electronic components 118 ane 120 can be directly mounted on the first component mounting surface 114 and the second component mounting surface 116 using surface mount technology. Alternately, the one or more electronic components 118 and 120 can be assembled into modules or packages, such as ceramic modules or dual-in-line-packages, and the modules or packages can be mounted on the first component mounting surface 114 and the second component mounting surface 116.

Figure 1C:
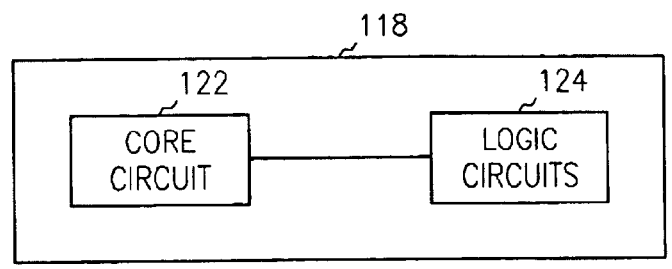
FIG. 1C shows a block diagram of the one or more electronic components shown in FIG. 1B in accordance with one embodiment of the invention.

FIG. 1C shows a block diagram of the one or more electronic components 118 in accordance with one embodiment of the invention. The one or more electronic components 118 include a core circuit 122 coupled to one or more logic circuits 124.

The core circuit 122 includes circuits that are capable of sending, receiving, processing, and storing information. In one embodiment, the core circuit 122 is a processor. In an alternate embodiment, the core circuit 122 is a network processor. In another alternate embodiment, the core circuit 122 is a memory circuit.

The one or more logic circuits 124 include circuits that perform functions such as shaping, modifying, or buffering electrical signals to assist the core circuit 122 in processing signals. In one embodiment, the one or more logic circuits 124 are field programmable gate arrays.

Referring again to FIG. 1B, the one or more electronic components 120 can include circuits similar to the core circuit 122 (shown in FIG. 1C) and the one or more logic circuits 124 (shown in FIG. 1C).

The first plurality of electrical contacts 104, 105, 106, and 107 and the second plurality of electrical contacts 109, 110, 111, and 112 are electrically coupled to the one or more electronic components 118 and 120. The first plurality of electrical contacts 104, 105, 106, and 107 and the second plurality of electrical contacts 109, 110, 111, and 112 are not limited to particular types of electrical contacts. Embodiments of the first plurality of electronic contacts 104, 105, 106, and 107 and the second plurality of electrical contacts 109, 110, 111, and 112 suitable for use in connection with the electronic package 100 are shown in FIGS. 3A, 3B, 3C, and 3D.

Figure 1D:
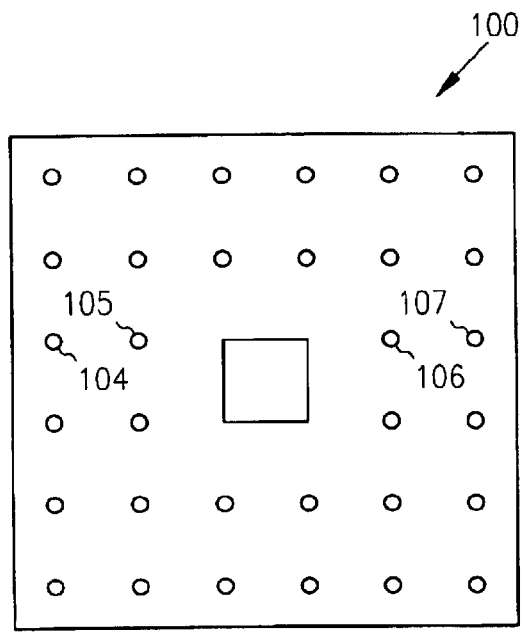
FIGS. 1D and 1E show a top view and a bottom view, respectively, of the electronic package shown in FIG. 1B.
Figure 1E:
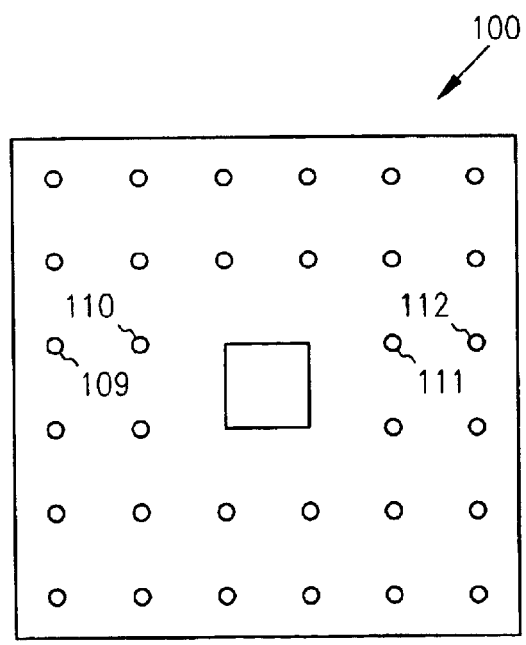

FIGS. 1D and 1E show a top view and a bottom view, respectively, of the electronic package 100 shown in FIG. 1B. The first plurality of electrical contacts 104, 105, 106, 107 has a configuration that is substantially identical to the configuration of the second plurality of electrical contacts 109, 110, 111, and 112. A configuration of electrical contacts includes both the number of electrical contacts and the spatial arrangement of the electrical contacts. A first configuration of electrical contacts is substantially identical to a second configuration of electrical contacts, if the number of electrical contacts in the first configuration equals the number of electrical contacts in the second configuration, and the spatial arrangement of the electrical contacts in the first configuration is substantially identical to the spatial arrangement of the electrical contacts in the second configuration. The spatial arrangement of the electrical contacts in a first configuration is substantially identical to the spatial arrangement of the electrical contacts in a second configuration, if the spacing between the two contacts in each pair of electrical contacts in the first configuration is substantially identical to the spacing between the two contacts in the corresponding pair of electrical contacts in the second configuration. The spacing between two electrical contacts is the shortest distance between the two electrical contacts.

Figure 1F:
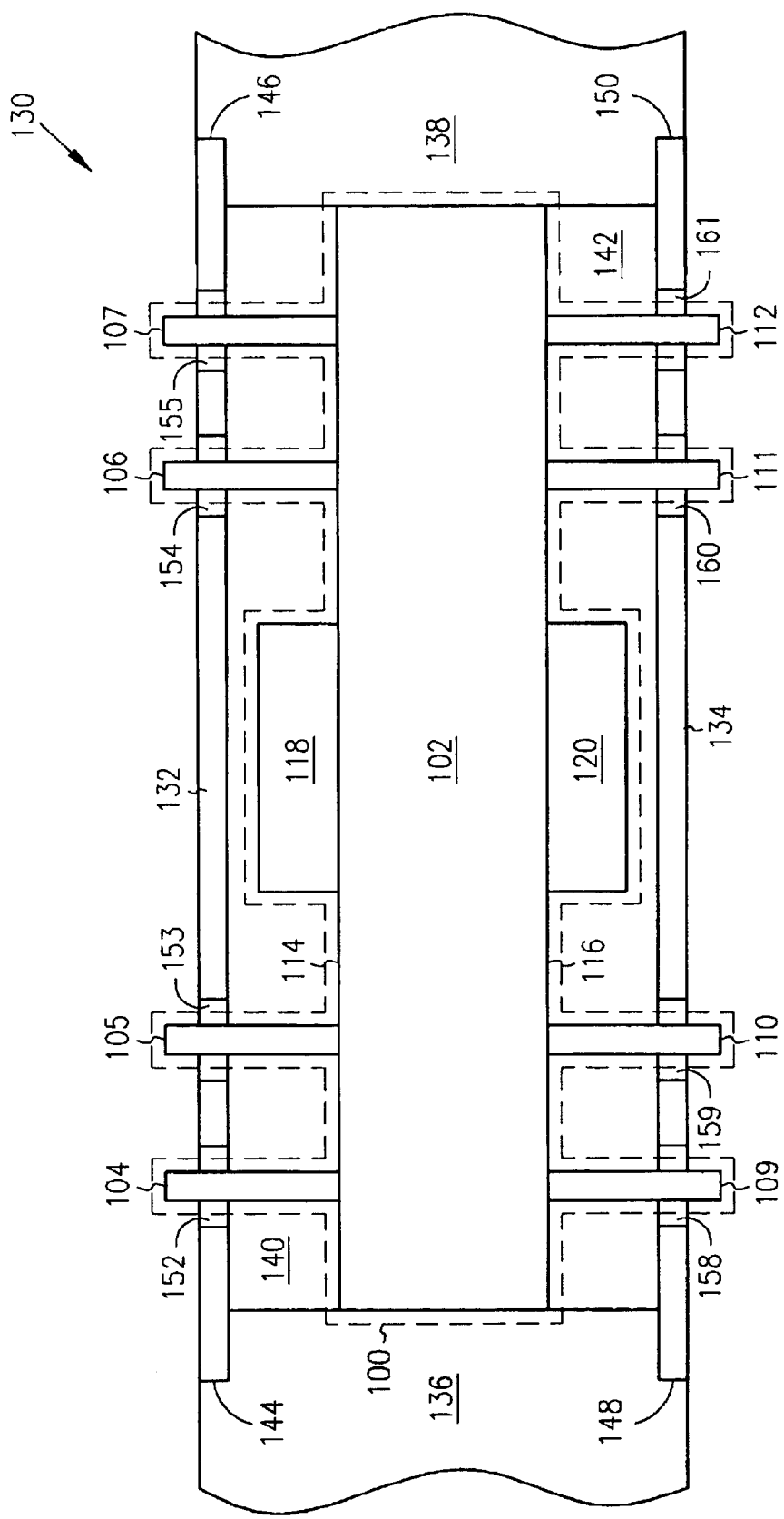
FIG. 1F shows a cross-sectional view of an electronic package that includes the electronic package shown in FIG. 1B in accordance with an alternate embodiment of the invention.

FIG. 1F shows a cross-sectional view of an electronic package 130 that includes the electronic package 100 shown in FIG. 1B in accordance with an alternate embodiment of the invention. The electronic package 130 further includes a first conductive substrate 132, a second conductive substrate 134, heat sinks 136 and 138, and thermally conductive materials 140 and 142. The first conductive substrate 132 is mounted adjacent to the thermally conductive material 140 and substantially parallel to the first component mounting surface 114. The second conductive substrate 134 is mounted adjacent to the thermally conductive material 142 and substantially parallel to the second component mounting surface 116. The first conductive substrate 132 has edges 144 and 146. The second conductive substrate 134 has edges 148 and 150. The edges 144, 146, 148, and 150 are substantially perpendicular to the first component mounting surface 114 and the second component mounting surface 116. The heat sink 136 is thermally coupled to the first conductive substrate 132 at the edge 144 and to the second conductive substrate 134 at the edge 148. The heat sink 138 is thermally coupled to the first conductive substrate 132 at the edge 146 and to the second conductive substrate 134 at the edge 150. The thermally conductive material 140 thermally couples the substrate 102 and the one or more electronic components 118 to the first conductive substrate 132 and to the heat sinks 136 and 138. The thermally conductive material 142 thermally couples the substrate 102 and the one or more electronic components 120 to the second conductive substrate 134 and to the heat sinks 136 and 138.

The first conductive substrate 132 includes apertures 152, 153, 154, and 155. Each of the apertures 152, 153, 154, and 155 provides access to one of the first plurality of electrical contacts 104, 105, 106, and 107. In one embodiment, each of the apertures 152, 153, 154, and 155 is a circular aperture. In an alternate embodiment, each of the apertures 152, 153, 154, and 155 is a square aperture. The second conductive substrate 134 includes apertures 158, 159, 160, and 161. Each of the apertures 158, 159, 160 and 161 provides access to one of the second plurality of electrical contacts 109, 110, 111, and 112. In one embodiment, each of the apertures 158, 159, 160, and 161 is a circular aperture. In an alternate embodiment, each of the apertures 158, 159, 160, 161 is a square aperture.

The first conductive substrate 132 is not limited to a particular shape, and the second conductive substrate 134 is not limited to a particular shape. The shape of the first conductive substrate 132 and the shape of the second conductive substrate 134 are selected to efficiently and economically remove heat from the electronic package 130. In one embodiment, the first conductive substrate 132 is a substantially rectangular conductive plate, and the second conductive substrate 134 is a substantially rectangular conductive plate. In an alternate embodiment, the first conductive substrate 132 is a substantially rectangular conductive plate, and the second conductive substrate 134 is a substantially circular conductive plate.

The first conductive substrate 132 is not limited to being formed from a particular material. In one embodiment, the first conductive substrate 132 is formed from copper. In an alternate embodiment, the first conductive substrate 132 is formed from a nickel plate covered with a copper layer. In another alternate embodiment, the first conductive substrate 132 is formed from a nickel-tin plate covered with copper. In still another alternate embodiment, the first conductive substrate 132 is formed from a thermally conductive metal formed on a non-metallic substrate.

The second conductive substrate 134 can be formed from the same material as the first conductive substrate 132 or from a different material. Forming the first conductive substrate 132 and the second conductive substrate 134 from different materials allows tailoring the thermal conductivity of the electronic package 130 to efficiently and economically remove heat from the one or more electronic components 118 and 120. In one embodiment, the first conductive substrate 132 is formed from a first material having a first conductivity and the second conductive substrate 134 is formed from a second material having a second conductivity not equal to the first conductivity.

The heat sinks 136 and 138 thermally couple heat generated at the first conductive substrate 132 and the second conductive substrate 134 to the ambient environment. In another embodiment, if the heat sinks 136 and 138 are unable to remove sufficient heat from the electronic package 130, then one or more additional heat sinks (not shown) are thermally coupled to the first conductive substrate 132 and the second conductive substrate 134. In still another embodiment, the heat sink 136 and the heat sink 138 are extended to form a continuous heat sink along the periphery of the first conductive substrate 132 and the second conductive substrate 134.

The thermally conductive materials 140 and 142 provide a path to conduct heat from the electronic components 118 and 120 and the component mounting surfaces 114 and 116 to the first conductive substrate 132 and the second conductive substrate 134. In one embodiment, the thermally conductive materials 140 and 142 are an electrically non-conductive solid. In an alternate embodiment, the thermally conductive materials 140 and 142 are an electrically non-conductive gas. An exemplary gas suitable for use in connection with the electronic package 130 is air. In another alternate embodiment, the thermally conductive materials 140 and 142 are an electrically non-conductive liquid.

One exemplary solid suitable for use in connection with the electronic package 130 is a composite of $Al_2O_3$. In one embodiment, an $Al_2O_3$ powder of between about 20% and about 40% by volume when mixed with an epoxy resin is chemically or thermally polymerized to form the composite of $Al_2O_3$. Another exemplary solid, suitable for use in connection with the electronic package 130, is a composite mixture of a graphite powder and silicon oxide. In one embodiment, a graphite powder of between about 3% and about 5% by volume and silicon oxide of between about 15% and about 35% by volume when mixed with an epoxy resin is chemically or thermally polymerized to form the composite mixture of graphite powder and silicon dioxide. Another exemplary solid suitable for use in connection with the electronic package 130 is a silicon paste. In one embodiment, silicon dioxide is mixed with a silicon oil gel to form the silicon paste. Another exemplary solid suitable for use in connection with the electronic package 130 is a ceramic.

During the operation of the electronic package 130, the one or more electronic components 118 and the one or more electronic components 120 generate heat. The heat generated by the one or more electronic components 118 flows from the one or more electronic components 118 through the thermally conductive material 140 to the first conductive substrate 132. The heat flows from the outer surface of the first conductive substrate 132 into the ambient environment, from the edge 144 of the first conductive substrate 132 to the heat sink 136, and from the edge 146 of the first conductive substrate 132 to the heat sink 138. The heat flows from the heat sinks 136 and 138 to the ambient environment.

The heat generated by the one or more electronic components 120 flows from the one or more electronic components 120 through the thermally conductive material 142 to the second conductive substrate 134. The heat flows from the outer surface of the second conductive substrate 134 into the ambient environment, from the edge 148 of the second conductive substrate 134 to the heat sink 136, and from the edge 150 of the second conductive substrate 134 to the heat sink 138. The heat flows from the heat sinks 136 and 138 to the ambient environment.

Figure 2:
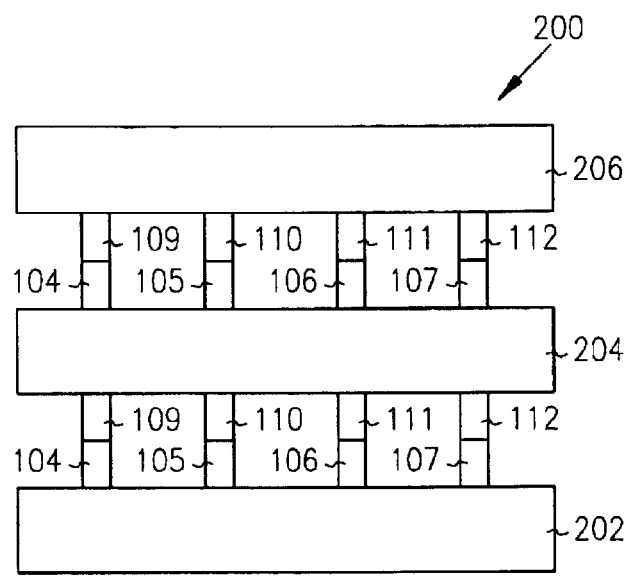
FIG. 2 shows a side view of a stacked electronic package in accordance with one embodiment of the invention.

FIG. 2 shows side view of a stacked electronic package 200 in accordance with one embodiment of the invention. The stacked electronic package 200 includes a first electronic package 202, a second electronic package 204, and a third electronic package 206. The first electronic package 202 includes the first plurality of electrical contacts 104, 105, 106, and 107 (also shown in FIG. 1B). The second electronic package 204 includes the first plurality of electrical contacts 104, 105, 106, and 107 and the second plurality of electrical contacts 109, 110, 111, and 112 (also shown in FIG. 1B). The third electronic package 206 includes the second plurality of electrical contacts 109, 110, 111, and 112.

As shown in FIG. 2, the third electronic package 206 is stacked on the second electronic package 204 (the second plurality of electrical contacts 109, 110, 111, and 112 of the third electronic package 206 are aligned and electrically coupled to the first plurality of electrical contacts 104, 105, 106, and 107 of the second electronic package 204), and the second electronic package 204 is stacked on the first electronic package 202 (the second plurality of electrical contacts 109, 110, 111, and 112 of the second electronic package 204 are aligned and electrically coupled to the first plurality of electrical contacts 104, 105, 106, and 107 of the first electronic package 202). Stacking the first electronic package 202, the second electronic package 204, and the third electronic package 206, as shown in FIG. 2, results in the first electronic package 202 and the third electronic package 206 being electrically coupled to the second electronic package 204.

The electrical coupling of the first electronic package 202, the second electronic package 204, and the third electronic package 206 permits the routing of electrical signals to electronic components (not shown) within the stacked electronic package 200. For example, electronic signals generated in the first electronic package 202 can be routed to the third electronic package 206.

In an alternate embodiment, the first electronic package 202 includes the electronic package 100 (shown in FIG. 1A), the second electronic package 204 includes the electronic package 100, and the third electronic package 206 includes the electronic package 100.

In another alternate embodiment, the first electronic package 202 includes the electronic package 130 (shown in FIG. 1F), the second electronic package 204 includes the electronic package 130, and the third electronic package 206 includes the electronic package 130.

In still another alternate embodiment, the first electronic package 202 includes the electronic package 130, the second electronic package 204 includes the electronic package 100, and the third electronic package 206 includes the electronic package 130.

Connectors (not shown) can be added to the stacked electronic package 200 to provide for receiving and transmitting signals. Alternately, the electronic package 200 can include a wireless transceiver (not shown) for transmitting and receiving signals.

In operation, the one or more electronic components 118 and 120 (shown in FIGS. 1B and 1F) included in the stacked electronic package 200 produce heat. For embodiments of the stacked electronic package 200 that include electronic package 100, the heat is removed from the stacked electronic package 200 primarily by convection. For embodiments of the stacked electronic package 200 that include the electronic package 130, the heat is removed from the stacked electronic package 200 as described above for the electronic package 130.

Those skilled in the art will appreciate that the embodiment shown in FIG. 2 does not limit the present invention to a three package stack. Embodiments of the invention including any number of stacked electronic packages fall within the scope of the invention.

FIGS. 3A, 3B, 3C, and 3D show detailed illustrations of electrical contacts 301, 302, 303, and 304 in accordance with alternate embodiments of the invention. The electrical contacts 301, 302, 303, and 304 are fabricated from a conductive material such as gold, copper, or silver.

Each of the electrical contacts 301, 302, 303, and 304 includes a base 306, a body 308 and a tip 310. The base 306 provides a surface for mounting each of the electrical contact 301, 302, 303, and 304 on a first substrate mounting surface 114 (shown in FIGS. 1B and 1F) or a second substrate mounting surface 116 (shown in FIGS. 1B and 1F). In one embodiment, the base 306 is a substantially circular plate. In an alternate embodiment, the base 306 is a substantially square plate.

Figure 3A:
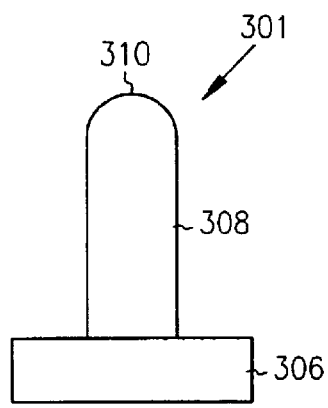
FIGS. 3A, 3B, 3C, and 3D show detailed illustrations of electrical contacts in accordance with alternate embodiments of the invention.
Figure 3B:
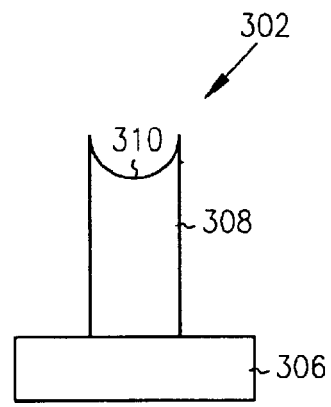
Figure 3C:
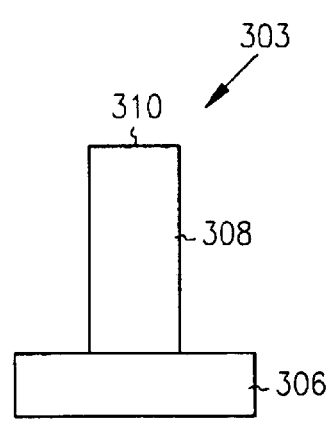
Figure 3D:
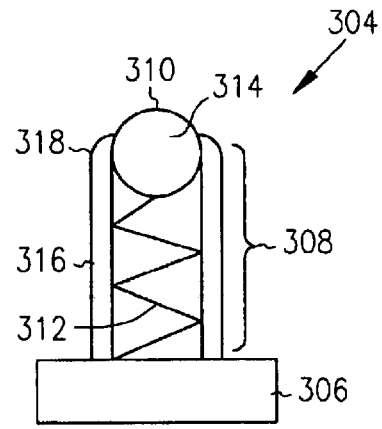

The body 308 electrically couples the base 306 to the tip 310. In one embodiment, the body 308 has a substantially cylindrical shape. In an alternate embodiment, the body 308 has a substantially square shape. In another alternate embodiment, the body 308 includes a spring 312, a ball 314, and a hollow containment element 316, as shown in FIG. 3D. The ball 314 is spring-loaded in the hollow containment element 316, as shown in FIG. 3D. The curved end 318 of the hollow containment element 316 is located opposite from the base 306 such that the movement of the ball 314 is restricted. Only a portion of the ball 314 extends out of the hollow containment element 316. The tension of the spring 312 is selected to be sufficient to supply a force to maintain a portion of the ball 314 outside the hollow containment element 316 when the ball 314 is pressed into contact with the tip 310 of the electrical contact 303.

The tip 310 provides a mating surface for electrically coupling two of the electrical contacts 301, 302, 303, and 304 together. In one embodiment, the tip 310 is a substantially concave shape (shown in FIG. 3A). In an alternate embodiment, the tip 310 is a substantially convex shape (shown in FIG. 3B). In another alternate embodiment, the tip 310 is substantially flat (shown in FIG. 3C). In still another alternate embodiment, the tip 310 is the surface of a substantially spherical ball (shown in FIG. 3D). The tip 310, to provide good electrical contact, has a gold or gold alloy surface. In one embodiment, the tip is gold coated kovar.

Each of the electrical contacts 301, 302, 303, and 304 is suitable for use in connection with the electronic package 100 (shown in FIG. 1B), the electronic package 130 (shown in FIG. 1F), and the stacked electronic package 200 (shown in FIG. 2). In one embodiment, each of the first plurality of electrical contacts 104, 105, 106, and 107 (shown in FIGS. 1B and 1F) is the electrical contact 301, and each of the second plurality of electrical contacts 109, 110, 111, and 112 (shown in FIGS. 1B and 1F) is the electrical contact 301. In an alternate embodiment, each of the first plurality of electrical contacts 104, 105, 106, and 107 is the electrical contact 301, and each of the second plurality of electrical contacts 109, 110, 111, and 112 is the electrical contact 302. In another alternate embodiment, each of the first plurality of electrical contacts 104, 105, 106, and 107 is the electrical contact 303, and each of the second plurality of electrical contacts 109, 110, 111, and 112 is the electrical contact 304.

Figure 4:
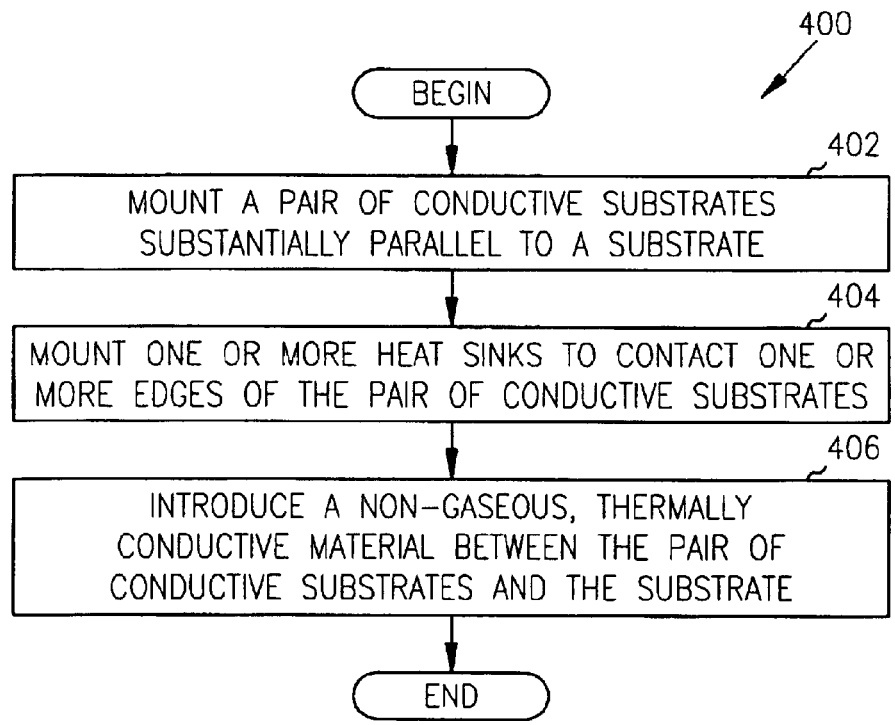
FIG. 4 shows a flow diagram of a method for forming an electronic package in accordance with one embodiment of the invention.

FIG. 4 shows a flow diagram of a method 400 for forming an electronic package 130 (shown in FIG. 1F) in accordance with one embodiment of the invention. The method 400 includes mounting a pair of conductive substrates substantially parallel to a substrate (block 402), mounting one or more heat sinks to contact one or more edges of the pair of conductive substrates (block 404), and introducing a non-gaseous, thermally conductive material between the pair of conductive substrates and the substrate (block 406). In an alternate embodiment, introducing a non-gaseous, thermally conductive material between the pair of conductive substrates and the substrate includes injecting a ceramic material between the pair of conductive substrates and the substrate. In another alternate embodiment, the alternate embodiment of the method 400 that includes injecting a ceramic material between the pair of conductive substrates, further includes mounting a first plurality of electrical contacts on a first component mounting surface of the substrate and mounting a second plurality of electrical contacts on a second component mounting surface of the substrate.

Figure 5:
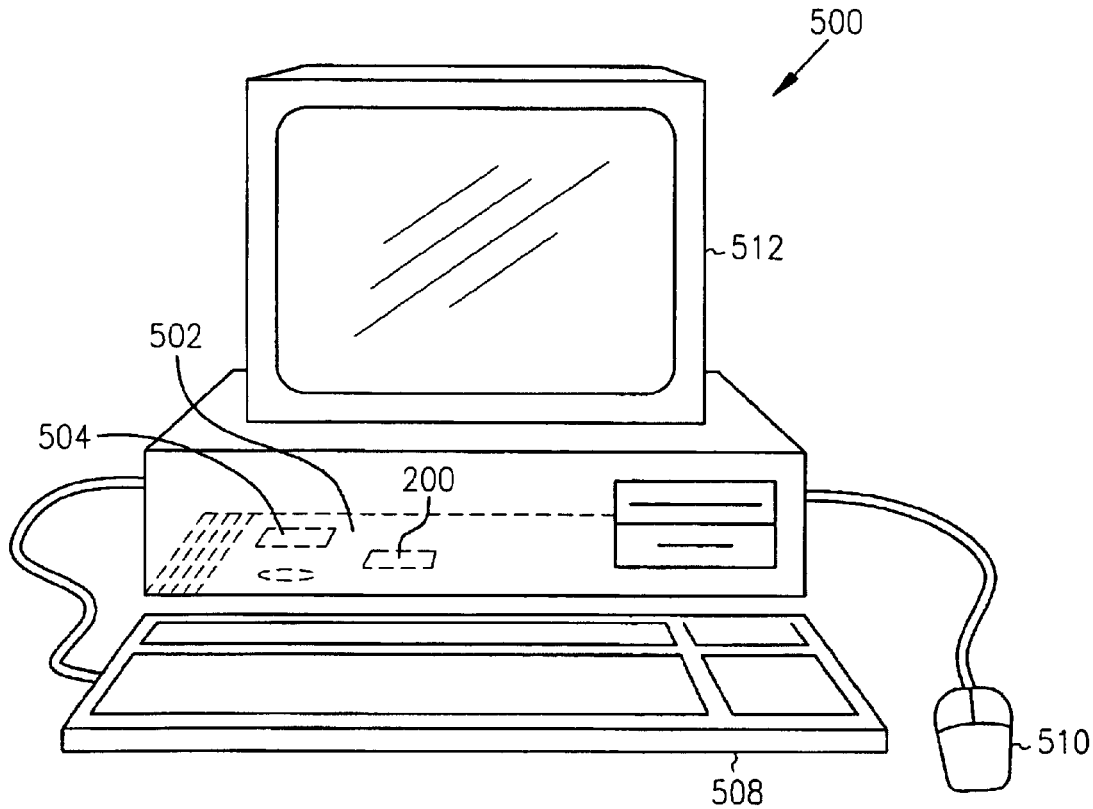
FIG. 5 shows an illustration of a computer system including the stacked electronic package shown in FIG. 2 in accordance with one embodiment of the invention.

FIG. 5 shows an illustration of a computer system 500 including the stacked electronic package 200 shown in FIG. 1F in accordance with one embodiment of the invention. The computer system 500 includes a system board 502, a processor 504, a keyboard 508, a mouse 510, a display 512, and the stacked electronic package 200. The system board 502 provides conductive paths to couple the processor 504 to the keyboard 508, the mouse 510, the display 512, and the stacked electronic package 200.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of embodiments of the present invention. Therefore, it is intended that this invention be limited only by the claims and the equivalents thereof.

What is claimed is:

1. An electronic package comprising:
    a substrate having a first component mounting surface having one or more locations for mounting electronic components and a second component mounting surface having one or more locations for mounting electronic components;
    a first plurality of electrical contacts located on the first component mounting surface, the first plurality of electrical contacts having a first configuration in which the first plurality of electrical contacts are located outside the locations for mounting electronic components on the first component mounting surface; and
    a second plurality of electrical contacts located on the second component mounting surface, the second plurality of electrical contacts having a second configuration, wherein the first configuration is substantially identical in arrangement to the second configuration.

2. The electronic package of claim 1, wherein each of the first plurality of electrical contacts includes a convex tip and each of the second plurality of electrical contacts includes a concave tip.

3. The electronic package of claim 2, wherein the convex tip of each of the first plurality of electrical contacts comprises gold coated kovar and the concave tip of each of the second plurality of electrical contacts comprises gold coated kovar.

4. The electronic package of claim 3, wherein the first plurality of electrical contacts is identical in number to the second plurality of electrical contacts.

5. An electronic package comprising:
    a substrate having a first component mounting surface and a second component mounting surface;

a first plurality of electrical contacts located on the first component mounting surface, the first plurality of electrical contacts having a first configuration;

a second plurality of electrical contacts located on the second component mounting surface, the second plurality of electrical contacts having a second configuration, wherein the first configuration is substantially identical in arrangement to the second configuration;

a first conductive substrate mounted substantially parallel to the first component mounting surface, the first conductive substrate having one or more apertures through which the first plurality of electrical contacts protrude; and a second conductive substrate mounted substantially parallel to the second component mounting surface, the second conductive substrate having one or more apertures through which the second plurality of electrical contacts protrude.

6. The electronic package of claim 5, wherein the first conductive substrate comprises a first conductive plate.

7. The electronic package of claim 6, wherein the second conductive substrate comprises a second conductive plate, wherein the first conductive plate has a first conductivity and the second conductive plate has a second conductivity less than the first conductivity.

8. The electronic package of claim 5, wherein the first conductive substrate includes a first conductive substrate edge and the second conductive substrate includes a second conductive substrate edge, wherein the first conductive substrate edge and the second conductive substrate edge are substantially perpendicular to the first component mounting surface and the first conductive substrate is coupled to a heat sink at the first conductive substrate edge and the second conductive substrate is coupled to the heat sink at the second conductive substrate edge.

9. The electronic package of claim 8, wherein a solid material that is thermally conductive and electrically non-conductive thermally couples the substrate to the first conductive substrate.

10. The electronic package of claim 9, wherein the solid material comprises a ceramic.

11. The electronic package of claim 9, wherein the solid material comprises a composite of $Al_2O_3$.

12. The electronic package of claim 9, wherein the solid material comprises a composite mixture of graphite and silicon oxide.

13. The electronic package of claim 9, wherein the solid material comprises silicon dioxide mixed to silicon oil as a gel.

14. The electronic package of claim 8, wherein a gas thermally couples the substrate to the second conductive substrate.

15. A stacked electronic package comprising:

a first electronic package;

a second electronic package stacked on the first electronic package and electrically coupled to the first electronic package, the second electronic package including a substrate having one or more electronic components mounted thereon, each of the one or more electronic components being thermally coupled to a first heat sink and a second heat sink; and a third electronic package stacked on the second electronic package and electrically coupled to the second electronic package.

16. The stacked electronic package of claim 15, wherein the second electronic package includes a first edge and a second edge substantially parallel to the first edge, the first heat sink being thermally coupled to the first edge and the second heat sink being thermally coupled to the second edge.

17. The stacked electronic package of claim 16, wherein the first electronic package includes a pair of edge mounted heat sinks.

18. The stacked electronic package of claim 17, wherein the second electronic package comprises:

a substrate having a first component mounting surface and a second component mounting surface;

a first plurality of electrical contacts located on the first component mounting surface; and a second plurality of electrical contacts located on the second component mounting surface, wherein the first plurality of electrical contacts are electrically coupled to the third electronic package and the second plurality of electrical contacts are electrically coupled to the first electronic package.

19. The stacked electronic package of claim 18, wherein each of the first plurality of electrical contacts includes a concave tip and each of the second plurality of electrical contacts includes a concave tip.

20. The stacked electronic package of claim 18, wherein the second electronic package includes an electronic component to route one or more signals from the first electronic package to the third electronic package.

21. The stacked electronic package of claim 20, wherein the electronic component comprises a processor.

22. The stacked electronic package of claim 21, wherein the first electronic package includes one or more electrical contacts, each of the one or more electrical contacts including a hollow containment element, a spring and a ball, the ball substantially constrained within the hollow containment element by the spring with a portion of the ball extending out of the hollow containment element to electrically couple to one of the first plurality of electrical contacts.

23. The stacked electronic package of claim 22, wherein the processor is coupled to a display and an input device.

24. A method comprising:

mounting a pair of substrates substantially parallel to a substrate, each conductive substrate having a substantially metallic surface that is thermally conductive;

mounting one or more heat sinks to contact one or more edges of the pair of conductive substrates; and introducing a non-gaseous, thermally conductive material between the pair of conductive substrates and the substrate.

25. The method of claim 24, wherein introducing the non-gaseous, thermally conductive material between the pair of conductive substrates and the substrate comprises injecting a ceramic material between the pair of conductive substrates and the substrate.

26. The method of claim 25, further comprising:

mounting a first plurality of electrical contacts on a first component mounting surface of the substrate; and mounting a second plurality of electrical contacts on a second component mounting surface of the substrate.

* * * * *